US006961884B1

(12) United States Patent
Draper

(10) Patent No.: US 6,961,884 B1
(45) Date of Patent: Nov. 1, 2005

(54) JTAG MIRRORING CIRCUITRY AND METHODS

(75) Inventor: Andrew M. Draper, Chesham (GB)

(73) Assignee: Altera Corporation, San Jose, CA (US)

( * ) Notice: Subject to any disclaimer, the term of this patent is extended or adjusted under 35 U.S.C. 154(b) by 586 days.

(21) Appl. No.: 09/880,749

(22) Filed: Jun. 12, 2001

Related U.S. Application Data

(60) Provisional application No. 60/211,094, filed on Jun. 12, 2000.

(51) Int. Cl.$^7$ ............................................. G01R 31/28
(52) U.S. Cl. ..................................... 714/726; 714/724
(58) Field of Search ................................ 714/724, 725, 714/726, 727, 733, 30, 39; 326/38, 39

(56) References Cited

U.S. PATENT DOCUMENTS

| | | | |
|---|---|---|---|
| 4,488,259 A | 12/1984 | Mercy | 364/900 |
| 4,617,479 A | 10/1986 | Hartmann et al. | |
| 4,710,927 A | 12/1987 | Miller | |
| 4,871,930 A | 10/1989 | Wong et al. | |
| 5,241,224 A | 8/1993 | Pedersen et al. | |
| 5,258,668 A | 11/1993 | Cliff et al. | |
| 5,260,610 A | 11/1993 | Pedersen et al. | |
| 5,260,611 A | 11/1993 | Cliff et al. | |
| 5,412,260 A | 5/1995 | Tsui et al. | 326/39 |
| 5,436,575 A | 7/1995 | Pedersen et al. | |
| 5,550,782 A | 8/1996 | Cliff et al. | |
| 5,590,354 A * | 12/1996 | Klapproth et al. | 714/30 |
| 5,768,288 A * | 6/1998 | Jones | 714/725 |
| 5,790,479 A | 8/1998 | Conn | |
| 6,097,211 A | 8/2000 | Couts-Martin et al. | 326/40 |
| 6,233,205 B1 | 5/2001 | Wells et al. | |
| 6,681,359 B1 * | 1/2004 | Au et al. | 714/733 |

OTHER PUBLICATIONS

"AT94K Series Field Programmable System Level Integrated Circuit," Advance Information Brochure of Atmel Corporation, Dec. 1999, 6 pages.
"CS2000 Reconfigurable Communications Procssor Family Product Brief," Advance Product Information from ChameleonSystems, Inc., 2000, pp. 1-8.
"Motorola Technical Developments," Magazine of Motorola, Inc., vol. 39, Sep. 1999, pp. i-vii and 77-80.
"Triscend E5 Configurable System-on-Chip Family," Product Description from Triscend Corporation, Jan., 2000 (Version 1.00), pp. i-ii and 1-90.
"Wireless Base Station Design Using Reconfigurable Communications Processors," Wireless Base Station White paper from ChameleonSystems, Inc., 2000, pp. 1-8.
Aitken, R.C., and Agarwal, V.K,, "A Diagnosis Method Using Pseudo-Random Vectors Without Intermediate Signatures," Proc. of Int. Conf. on Computer-Aided Design (ICCAD), IEEE pp. 574-577 (1989).

(Continued)

*Primary Examiner*—Guy Lamarre
*Assistant Examiner*—James C. Kerveros
(74) *Attorney, Agent, or Firm*—Townsend and Townsend and Crew LLP

(57) ABSTRACT

The present invention provides a JTAG mirroring circuit that augments the functionality of a JTAG circuit in an existing circuit design. The JTAG circuits include a TAP controller, an instruction register, and a plurality of data registers. The JTAG mirroring circuit of the present invention augments the functionality of pre-existing JTAG circuitry by introducing additional data registers that are multiplexed with data registers in the pre-existing JTAG circuit. Each of the additional data registers may perform functions that are not performed by data registers in the pre-existing JTAG circuit.

28 Claims, 10 Drawing Sheets

OTHER PUBLICATIONS

Ghosh-Dastidar, J., and Touba, N.A., "A Rapid and Scalable Diagnosis Scheme for BIST Environments With a Large Number of Scan Chains," Proc. of IEEE VLSI Test Symposium, pp. 79-85 (2000).

Ghosh-Dastidar, J., Das, D., and Touba, N.A., "Fault Diagnosis in Scan-Based BIST using Both Time and Space Information," Proc. of International Test. Conf., IEEE, pp. 95-102 (1999).

Mc Anney, M.G. and Savir, J., "There is Information in Faulty Signatures," Proc. of International Test Conf., IEEE, pp. 630-636 (1987).

Altera "APEX 20K Programmable Logic Device Family Data Sheet", May 1999.

Altera "FLEX 10K Embedded Programmable Logic Family Data Sheet", May 1999.

Altera "FLEX 8000 Programmable Logic Device Family Data Sheet", May 1999.

Altera "MAX 7000 Programmable Logic Device Family Data Sheet", May 1999.

Altera "IEEE 1149.1 (JTAG) Boundary-Scan Testing in Altera Devices" Aug. 1999, Application Note 39.

* cited by examiner

JTAG MIRRORING CIRCUITRY AND METHODS

CROSS-REFERENCES TO RELATED APPLICATIONS

The present application claims priority to U.S. Provisional Patent Application Ser. No. 60/211,094, filed Jun. 12, 2000, which is incorporated herein by reference in its entirety.

BACKGROUND OF THE INVENTION

The present invention relates to debugging support circuitry. More specifically, the present invention relates to circuitry that adds additional debugging functionality to a test access port (TAP) controller circuit.

As printed circuit boards (PCBs) have become more complex, the need for thorough testing becomes increasingly important. Advances in surface-mount packaging and PCB manufacturing have resulting in smaller boards, making traditional testing (e.g., external test probes and "bed-of-nails" test fixtures coupled to numerous pins on the PCB) harder to implement. As a result, cost savings from PCB space reductions are sometimes offset by cost increases in traditional testing methods.

In the 1980's, the Joint Test Action Group (JTAG) developed a specification for boundary-scan testing that was later standardized as the IEEE std. 1149.0-1990 specification. This boundary-scan testing (BST) architecture offers the capability to efficiently test components on PCBs with tight lead spacing. This BST architecture can test pin connections without using physical test probes and capture functional data while a device is operating normally.

BST circuitry typically includes a TAP controller, an instruction register, and data registers. Each data register is configured in hardware to perform one or more functions such as testing and debugging on stored and inputted data. An example of a data register is a boundary scan register which includes boundary-scan cells in a device that can force signals onto pins, or capture data from pin or core logic signals. Test data forced onto pins is serially shifted into the boundary-scan cells. Data captured from pins or core logic signals is serially shifted out and externally compared to expected results. Further details information regarding BST architecture is discussed in "IEEE 1149.1 (JTAG) Boundary-Scan Testing in Altera Devices," Application Note 39, August 1999, pp. 1–29.

The functionality of pre-existing BST circuitry is limited by the hardware configuration of the data registers. To add further testing and debugging functionality to the BST circuitry, additional data registers must be designed into the BST circuitry in advance. The functionality of BST circuitry is therefore limited by the hardware design of the device.

It would therefore be desirable to provide test scan circuitry that augments the functionality of a pre-existing JTAG BST circuit device.

It would also be desirable to provide additional test scan circuitry that can be configured to be compatible with any BST circuit device.

BRIEF SUMMARY OF THE INVENTION

The present invention includes JTAG mirroring circuitry that can be coupled to a pre-existing JTAG circuit to augment the functionality of the pre-existing JTAG circuit. The pre-existing JTAG circuit includes a TAP controller, an instruction register, and a plurality of data registers. The JTAG mirroring circuitry of the present invention also includes a TAP controller, an instruction register, and a plurality of data registers.

Each of the data registers of the pre-existing JTAG circuit and the JTAG mirroring circuit of the present invention are designed in hardware to perform one or more functions such as testing and/or debugging functions. The TAP controller controls the operation of a selected register in response to a test mode select signal. Data bits inputted into the instruction register controls which data register is selected.

The JTAG mirroring circuitry of the present invention augments the functionality of a pre-existing JTAG circuit by introducing additional data registers that are multiplexed with data registers in the pre-existing JTAG circuit. Each of the additional data registers may perform additional functions that are not performed by data registers in the pre-existing JTAG circuit. The TAP controller in the JTAG mirroring circuit controls the operation of a selected register in response to the test mode select signal. The instruction register in the JTAG mirroring circuit of the present invention controls which of the additional data registers is implemented.

Embedded logic which includes a processor may be added to a chip that contains a programmable logic portion. In one embodiment of the present invention, the functionality of JTAG circuitry that is part of the control logic associated with the programmable logic portion of the chip may be augmented by adding JTAG mirroring circuitry of the present invention to the embedded logic portion of the chip. The JTAG mirroring circuit is advantageous in this embodiment, because it provides a way to add functions to the JTAG circuit that already exists in the chip without having to supplan it. The JTAG circuitry added in the embedded logic need only include data registers that perform functions that are not already performed by data registers in the existing JTAG circuitry. JTAG mirroring circuitry may also be used to augment the functionality of a pre-existing JTAG circuit in a processor. The present invention also includes a variable length JTAG scan chain.

DETAILED DESCRIPTION OF THE INVENTION

Combining programmable logic, memory, and a processor core, Altera's new Excalibur™ embedded processor solutions allow engineers to integrate an entire system on a single programmable logic device (PLD). The three families—(1) the Nios™ soft core embedded processor, (2) the ARM®-based hard core embedded processor, and (3) the MIPS-based® hard core embedded processor-gives users the flexibility of processor cores with the integration of system-on-a-programmable-chip (SOPC) logic.

Excalibur embedded processors can be used in a wide range of applications, from industrial instrumentation to DSL access concentrators. They offer full integration with Altera's APEX™ PLD architecture, and include the Quartus™ development tool, optimized for the Excalibur embedded processor families.

Figure 1:
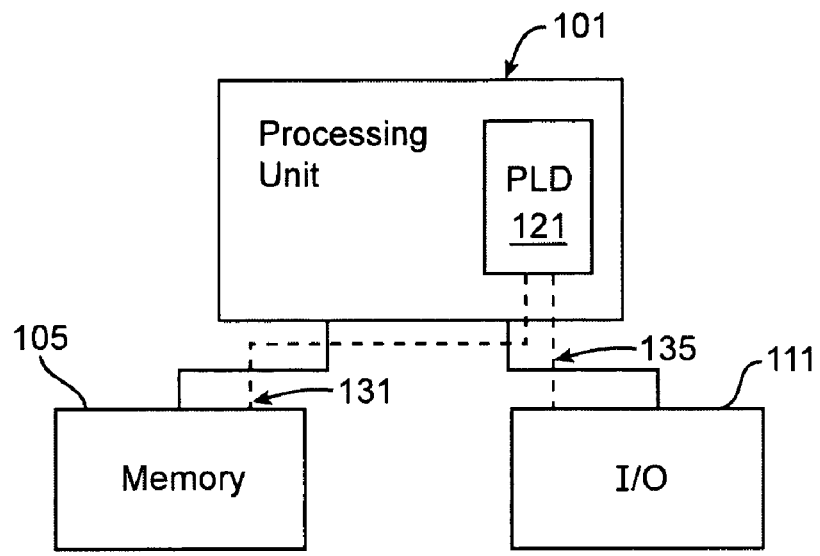
FIG. 1 is diagram of a digital system with a programmable logic integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated by reference for all purposes. Programmable logic devices are currently represented by, for example, Altera's MAX®, FLEX®, and APEX series of PLDs. These are described in, for example, U.S. Pat. Nos. 4,871,930, 5,241,224, 5,258, 668, 5,260,610, 5,260,611, 5,436,575, and the *Altera Data Book* (1999), all incorporated by reference in their entirety for all purposes. Programmable logic integrated circuits and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
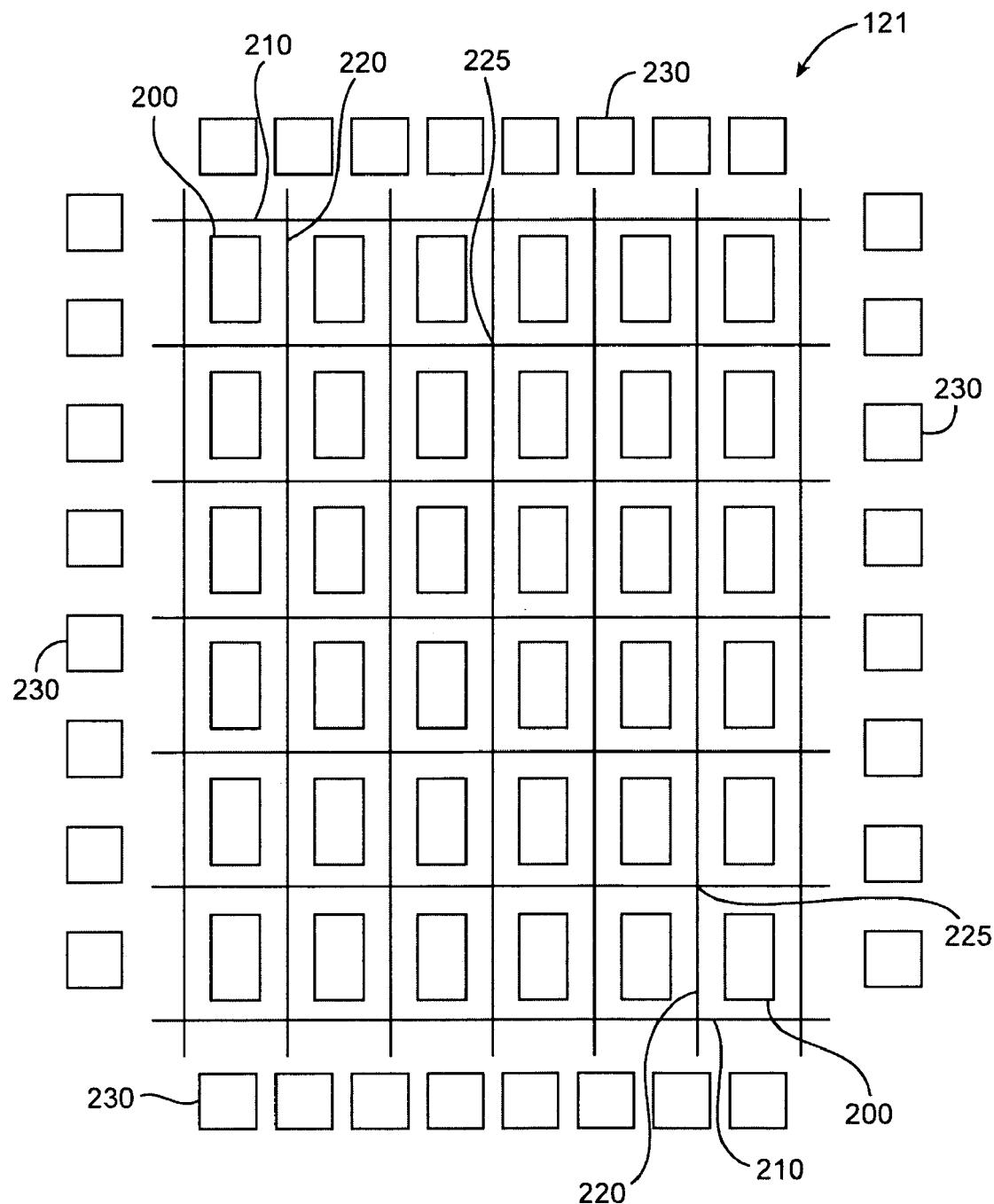
FIG. 2 is a diagram showing an architecture of a programmable logic integrated circuit.

FIG. 2 is a simplified block diagram of an overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver. In other embodiments of a programmable logic integrated circuit, the input-output drivers may be embedded with the integrated circuit core itself. This embedded placement of the input-output drivers may be used with flip chip packaging and will minimize the parasitics of routing the signals to input-output drivers.

Figure 3:
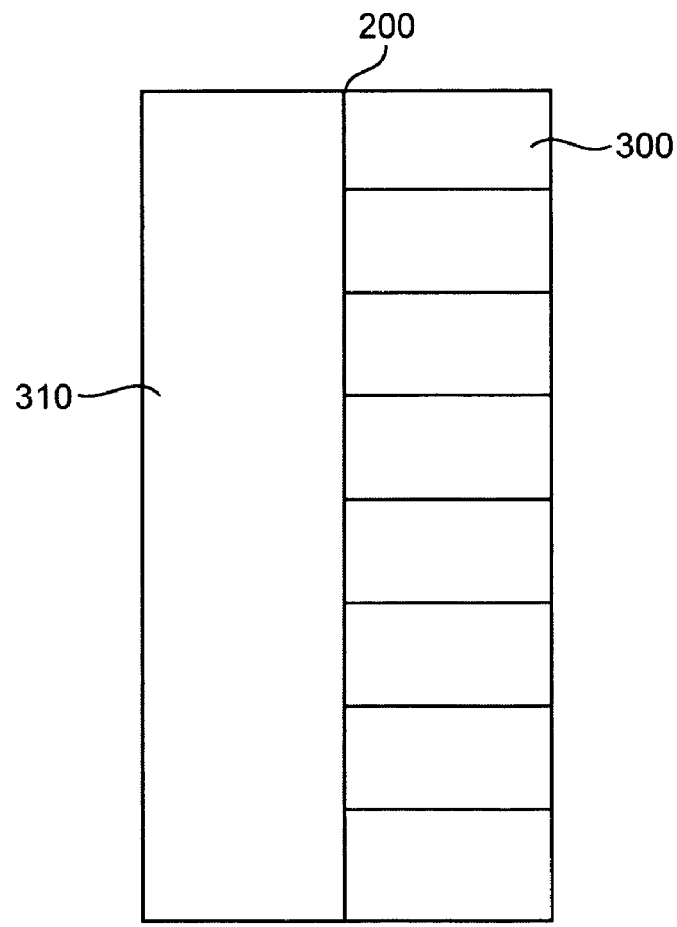
FIG. 3 is a simplified block diagram of a logic array block (LAB)

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
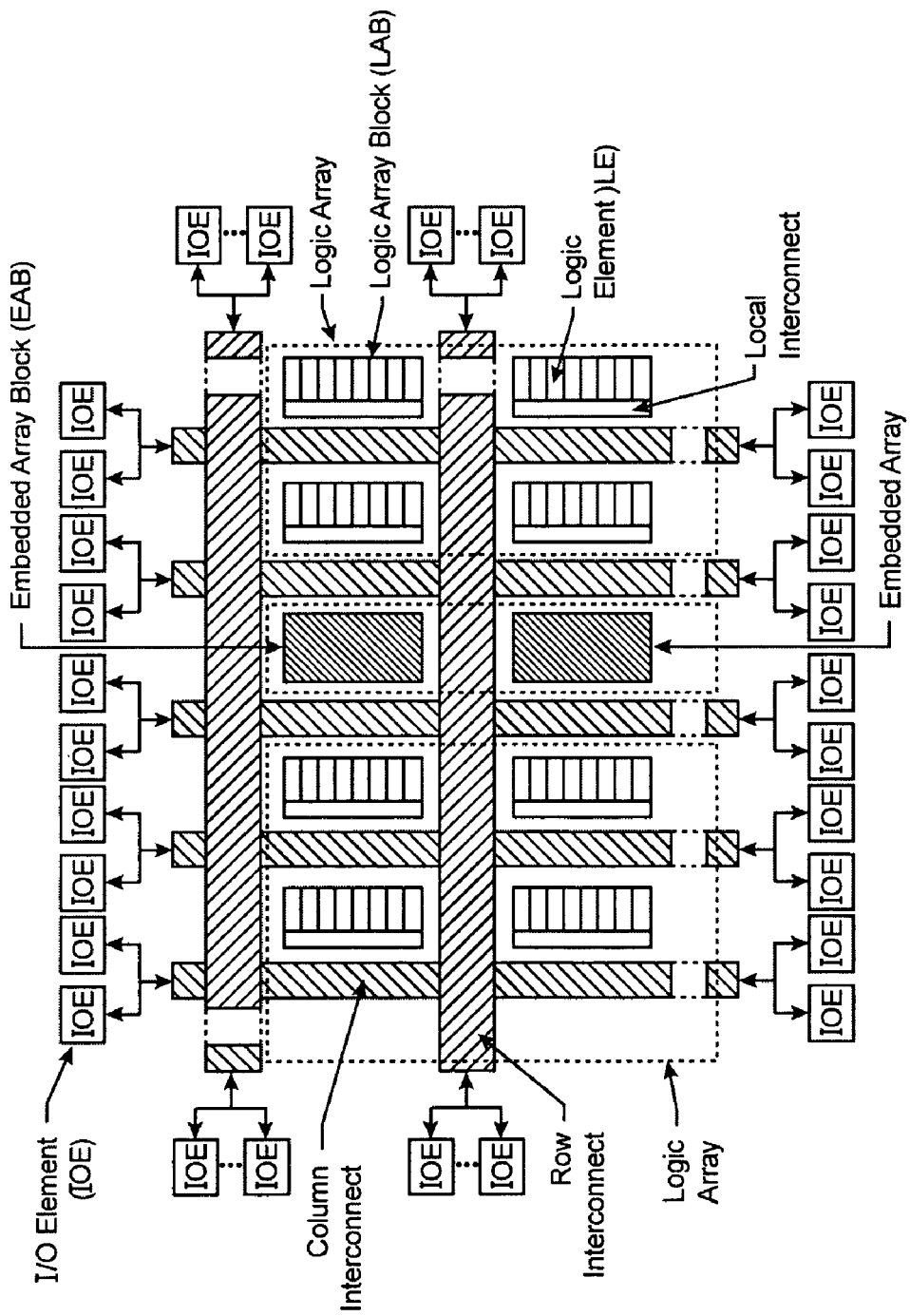
FIG. 4 shows an architecture of a programmable logic integrated circuit with embedded array blocks (EABs)

FIG. 4 shows a PLD architecture similar to that in FIG. 2. The architecture in FIG. 4 further includes embedded array blocks (EABs). EABs contain user memory, a flexible block of RAM. More discussion of this architecture may be found in the *Altera Data Book* (1999) in the description of the FLEX 10K product family and also in U.S. Pat. No. 5,550, 782, which are incorporated by reference.

Figure 5:
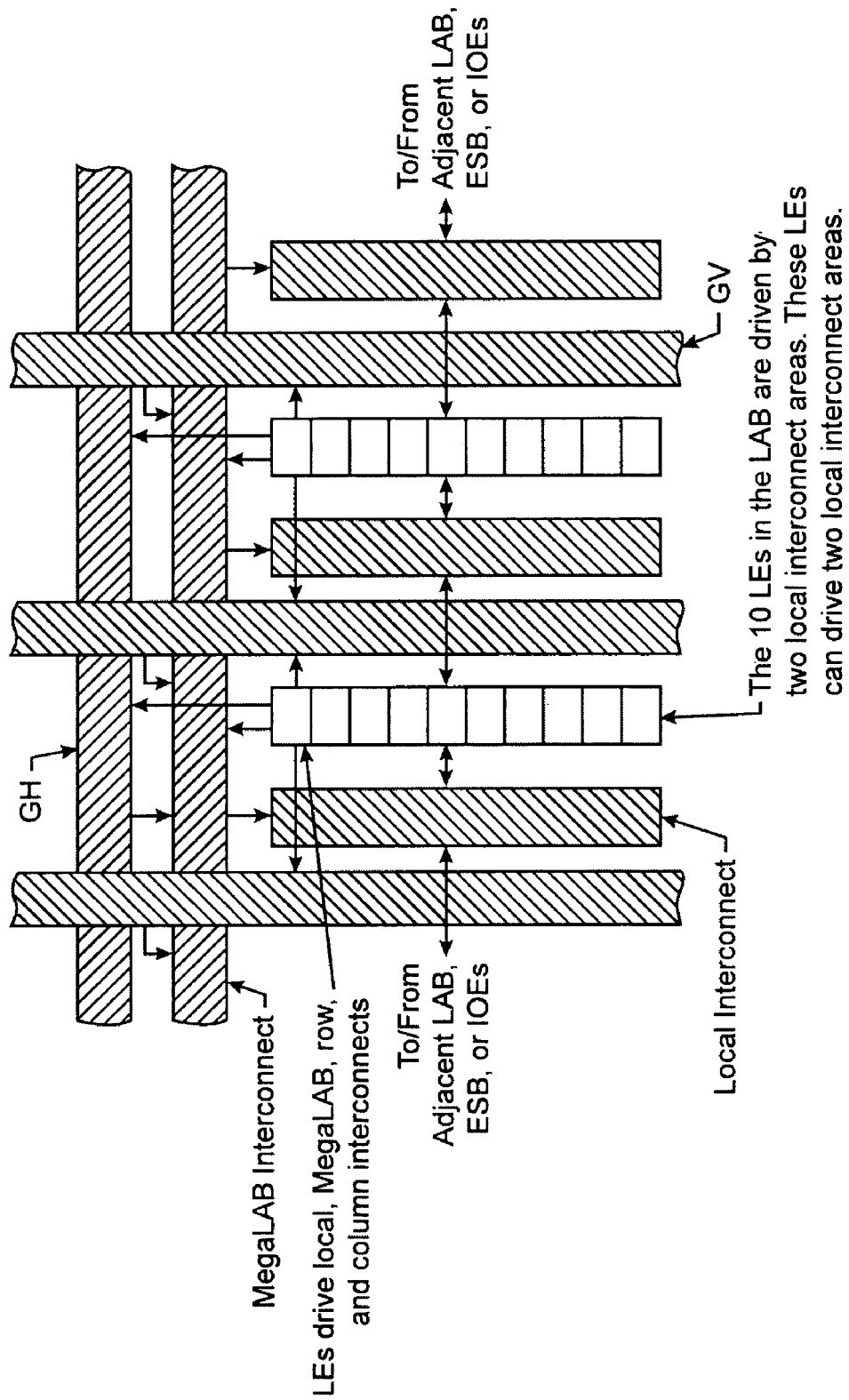
FIG. 5 shows an architecture of a programmable logic integrated circuit with megaLABs.

FIG. 5 shows a further embodiment of a programmable logic integrated circuit architecture. FIG. 5 only shows a portion of the architecture. The features shown in FIG. 5 are repeated horizontally and vertically as needed to create a PLD of any desired size. In this architecture, a number of LABs are grouped together into a megaLAB. In a specific embodiment, a megaLAB has sixteen LABs, each of which has ten LEs. There can be any number of megaLABs per PLD. A megaLAB is programmably connected using a megaLAB interconnect. This megaLAB interconnect may be considered another interconnect level that is between the global interconnect and local interconnect levels. The megaLAB interconnect can be programmably connected to GVs, GHs, and the local interconnect of each LAB of the mega-LAB. Compared to the architecture of FIG. 2, this architecture has an additional level of interconnect, the megaLAB interconnect. Such an architecture is found in Altera's APEX™ family of products, which is described in detail in the *APEX 20K Programmable Logic Device Family Data Sheet* (November 1999), which is incorporated by reference. In a specific implementation, a megaLAB also includes an embedded system block (ESB) to implement a variety of memory functions such as CAM, RAM, dual-port RAM, ROM, and FIFO functions.

In an aspect of the invention, an integrated circuit includes on the same semiconductor substrate a programmable logic portion and an embedded logic portion which includes a processor. The programmable logic portion includes features discussed above. In a particular implementation, the programmable logic portion of the integrated circuit is similar to the APEX 20K architecture, and in particular the APEX 20K1000E device. The embedded logic portion of the integrated circuit includes an on-chip RAM section, ARM or MIPS CPU (central processing unit) section, cache section (for the CPU), external bus interface section, and a UART section. The CPU section has a JTAG/debug external interface. The external bus interface can interface to external devices. The UART can interface with a serial port.

Figure 6:
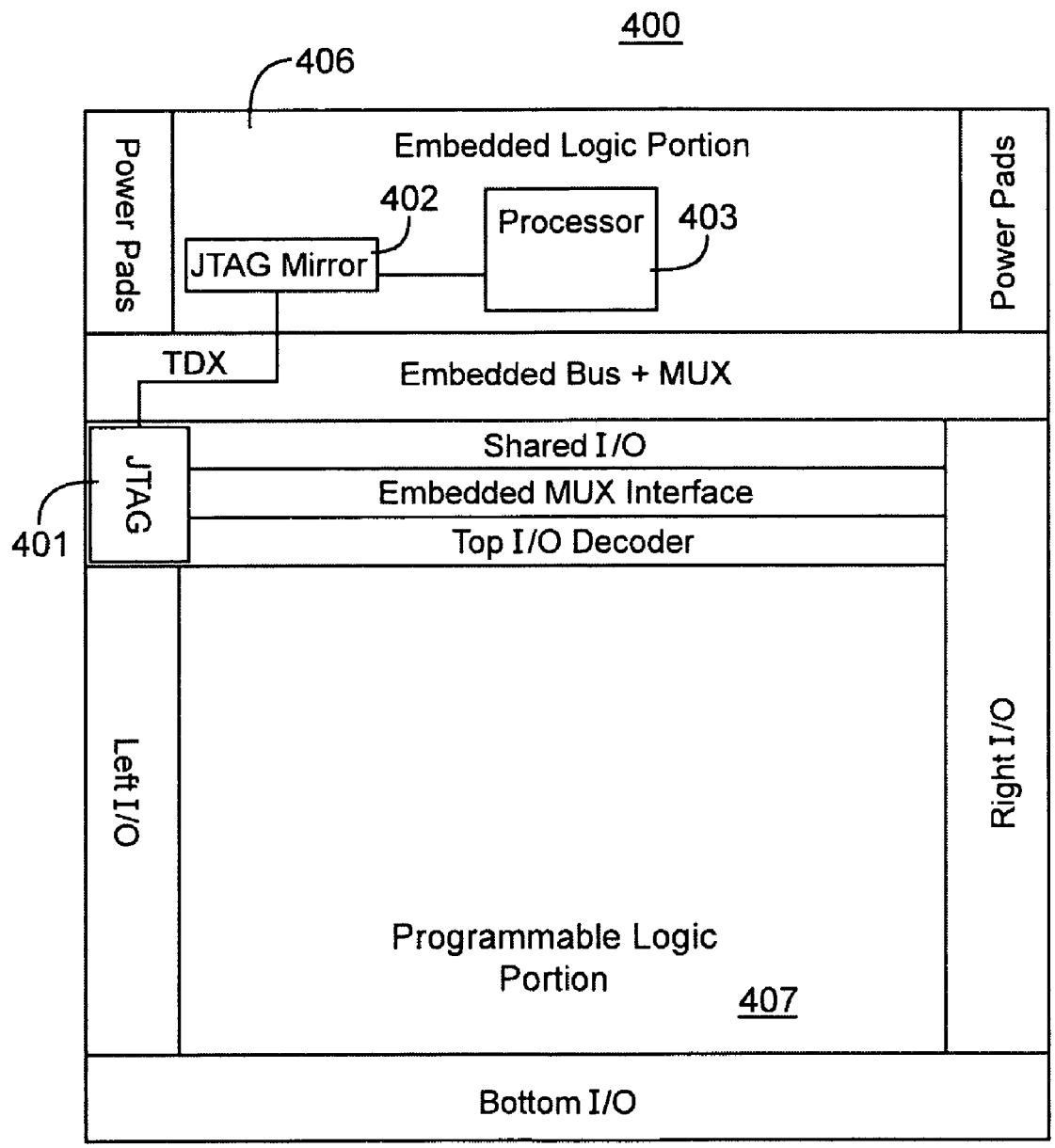
FIG. 6 is a diagram of a chip with a programmable logic device portion and a embedded logic portion, each comprising JTAG circuitry of the present invention.

Chip 400 shown in FIG. 6 is an example of a chip that contains an embedded logic portion and a programmable logic portion. Chip 400 includes programmable logic portion 407 and embedded logic portion 406. Embedded logic portion 406 includes processor 403 and JTAG mirror circuit 402. Processor 403 may be, for example, an ARM 922 or ARM 946. Chip 400 also includes left, right, and bottom input/output (I/O) pads that are used by external components to access data in and transmit data to logic and memory circuits in programmable logic portion 407. Chip 400 may include shared I/O pads that can be used by processor 403 and circuitry in programmable logic portion 407. The embedded MUX interfaces above and below the shared I/O section multiplexes signals between the shared I/O pads, programmable logic portion 407 and embedded logic portion 406. Signals to and from programmable logic portion 407 are decoded by the top I/O decoder.

Chip 400 includes JTAG BST (boundary test scan) circuit 401, that is part of the control logic associated with programmable logic portion 407. JTAG circuit 401 (as well as programmable logic portion 407) are part of an existing set of programmable logic circuitry (such as the APEX 20K circuit). The existing programmable logic circuit (including the control logic) would typically have to be redesigned to accommodate additional testing and debugging functions for data stored in the programmable logic circuitry. Redesigning an existing programmable logic circuit that is functional involves the risk that the redesigned circuit may contain bugs that are not present in the original design. It takes time and effort to debug a newly designed circuit. It is substantially less risky to add new testing and debugging functions by simply placing additional circuitry on-chip to augment (rather than replace) the existing programmable logic circuit design.

Therefore, it is advantageous to add JTAG mirror circuit 402 to chip 400 to augment the functionality of JTAG BST circuit 401 rather than redesign circuit 401. JTAG mirroring circuit 402 interfaces with JTAG BST circuit 401. JTAG mirroring circuit 402 is advantageous in this embodiment, because it provides a way to add testing and debugging functions to JTAG circuit 401 without have to replace it. JTAG circuit 402 only needs to include data registers that perform functions that are not already performed by data registers in JTAG circuit 401. JTAG circuit 402 is coupled to JTAG circuit 401 and processor 403 as shown in FIG. 6.

Figure 7:
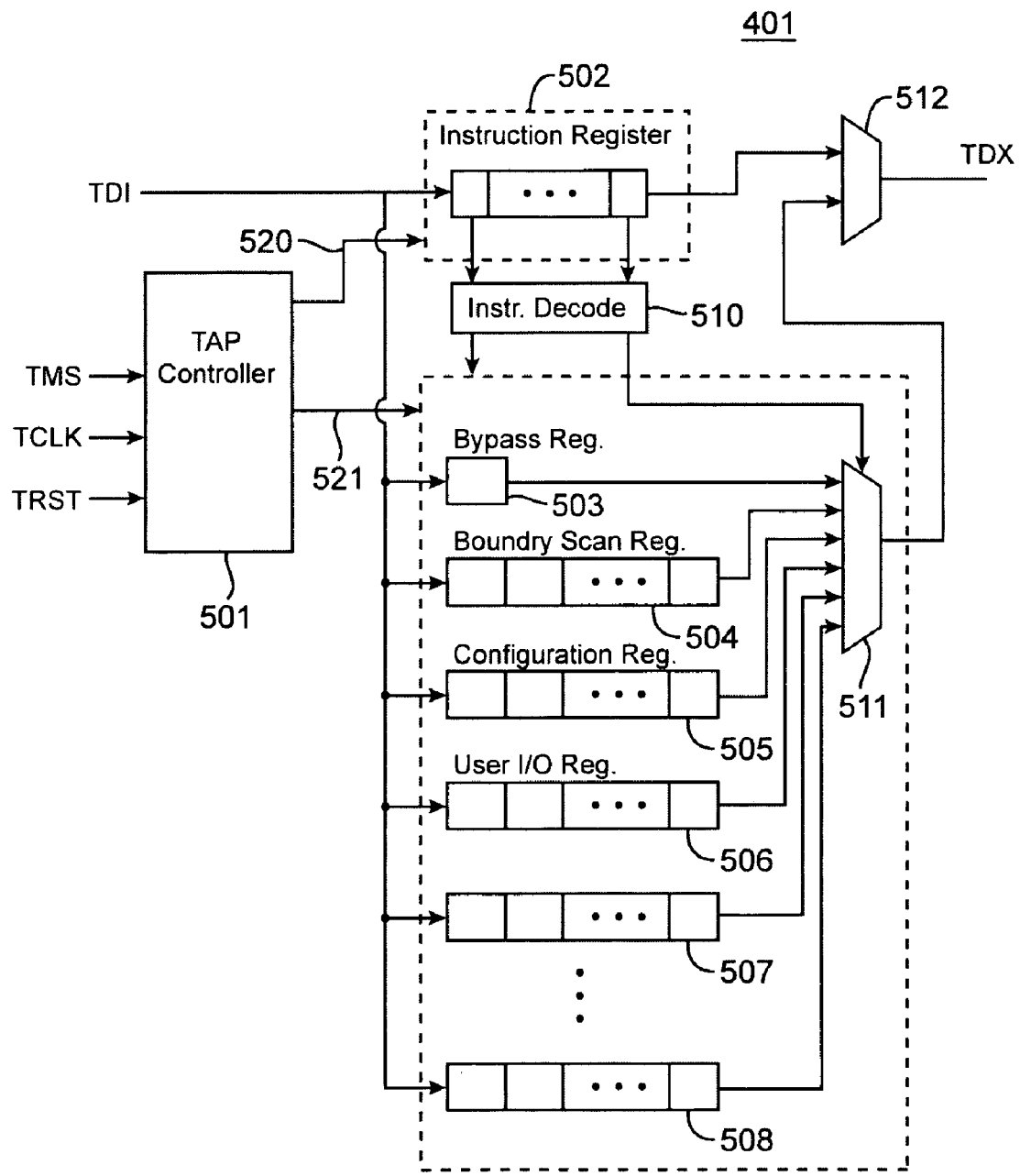
FIG. 7 is a diagram of a JTAG circuit in a programmable logic device.

A detailed diagram of JTAG boundary test scan (BST) circuit 401 is shown in FIG. 7. BST circuit 401 includes TAP controller 501, instruction register 502, data registers such as registers 503–508, and multiplexers 511–512. BST circuit 401 may include any number of data registers in addition to or instead of the data registers shown in FIG. 7. The TAP controller and the instruction registers are also referred to as the state machine portion of the JTAG BST circuit.

TAP controller 501 is responsive to clock signal TCLK and test mode select signal TMS. If desired, TAP controller 501 may also be responsive to reset signal TRST. Clock signal TCLK controls the timing of circuitry within TAP controller 501.

TAP controller 501 also sends control signals along each of control lines 520 and 521 to instruction register 502 and data registers 503–508, respectively. Each of control lines 520 and 521 includes signals UPDATEIR, CLOCKIR, and SHIFTIR. These control signals control the operation of the instruction register and the data registers. For example, control signals on lines 520–521 control when bits are serially shifted through instruction register 502 and data registers 503–508 in response the TMS signal. Bits are serially shifted into instruction register 502 and data registers 503–508 from the test mode input (TDI) signal.

Bits that are loaded into instruction register 502 are decoded by instruction decoder 510. The decoded output signals of decoder 510 determine which one of data registers 503–508 is selected. When one of data registers 503–508 is selected, the functions of that data register are performed by BST circuit 401.

Other output signals of decoder 510 control multiplexer 511. Multiplexer 511 selects one of data registers 503–508 and couples it to an input of multiplexer 512. TAP controller 501 sends a signal (not shown) to a select input of multiplexer 512 which determines whether one of data registers 503–508 or instruction register 502 is coupled to output TDX. When multiplexer 512 couples one of data registers 503–508 or instruction register 502 to output TDX, data stored in that register may be serially shifted out of that register to the TDX output.

When data bits in instruction register 502 cause Bypass register 503 to be selected, data signals can be serially shifted out of Bypass register 503 to the TDX output. The data bits in Bypass register 503 comprise a predictable array of bits that do not perform any particular functionality. Therefore, when Bypass register 503 is selected, the functionality of BST circuit 401 is bypassed. When BST circuit 401 does not recognize the decoded output of instruction decoder 510, Bypass register 503 is selected, and the data signals in Bypass register 503 are outputted by default.

When data bits in instruction register 502 cause Boundary Scan register 504 to be enabled and selected by multiplexers 511–512, data bit signals can be serially shifted into Boundary Scan register 504 from the TDI input and out of Boundary Scan register 504 to the TDX output. Boundary Scan register 504 is configured to perform various testing and debugging functions. For example, Boundary Scan register 504 may comprise I/O pins, dedicated inputs, or dedicated configuration bits. Boundary Scan register 504 may be used to test I/O pin connections or to capture internal data so that it may be tested. Data may be received from internal core logic at the TDI input and forced onto external I/O pins for testing and debugging. Alternatively, data may be received at external I/O pins and sent to the internal core logic so that it may be compared against internally stored data for testing and debugging purposes. Testing may be performed in this manner to determine if the I/O pins or the core logic is configured properly.

When data bits in instruction register 502 cause Configuration register 505 to be selected, data signals can be shifted into and out of Configuration register 505. Configuration register 505 is used to load data into the internal core logic. The internal core logic may be, for example, programmable logic portion 407 shown in FIG. 6. Configuration register 505 may be used to load data into circuits within programmable logic portion 407 to configure the programmable logic image.

When data in instruction register 502 causes User I/O register 506 to be selected, data signals can be shifted into and out of User I/O register 506. User I/O register 506 may be used by a user to transmit data to or receive data, for example, via external I/O pins. Further details of the operation of JTAG BST circuitry are discussed in "IEEE 1149.1 (JTAG) Boundary-Scan Testing in Altera Devices," Application Note 39, August 1999, pp. 1–29, which is hereby incorporated by reference herein in its entirety for all purposes.

Figure 8:
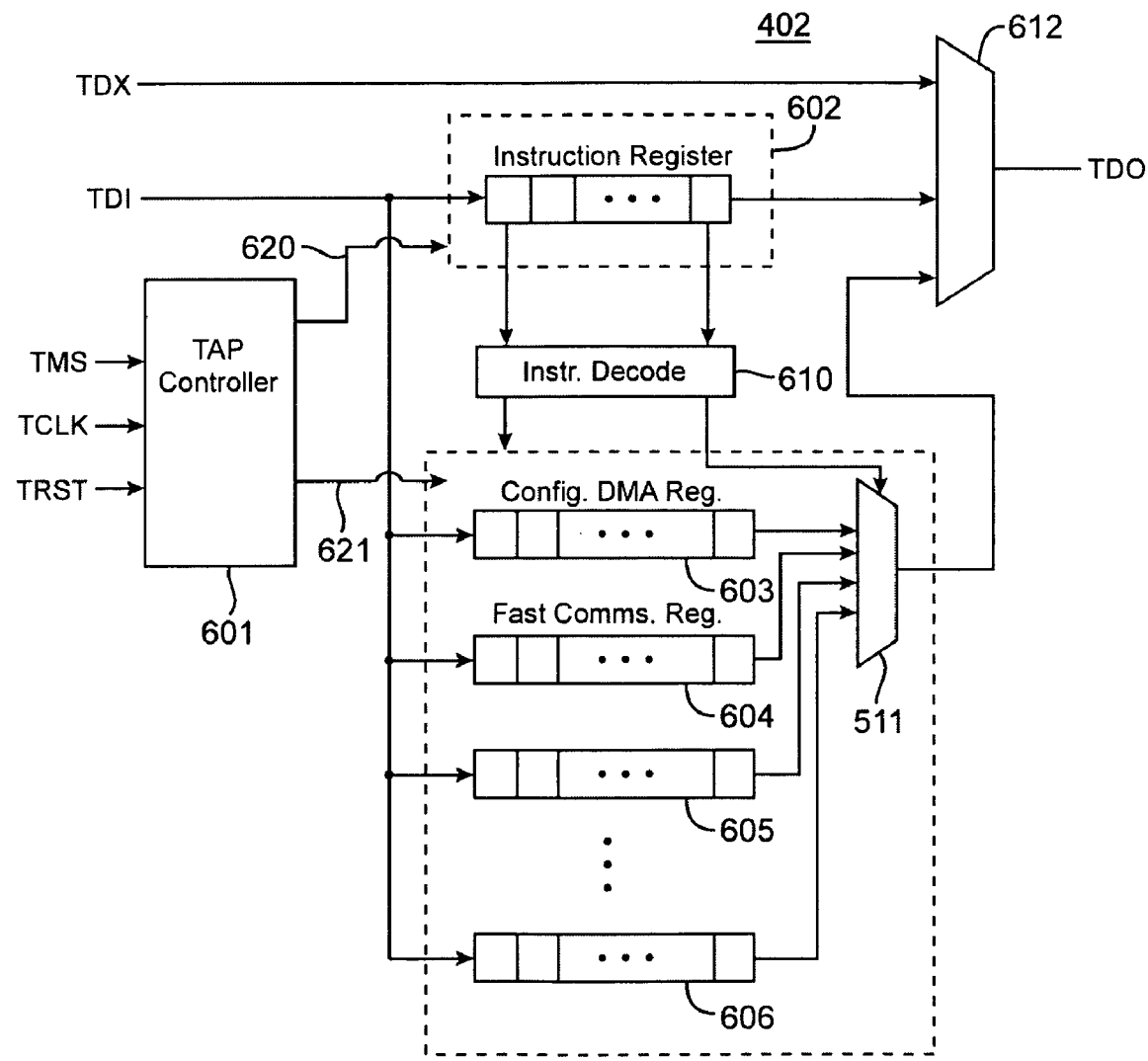
FIG. 8 is a diagram of a JTAG mirroring circuit of the present invention in an embedded logic portion of a chip that is coupled to another JTAG circuit.

An embodiment of the JTAG mirroring circuitry of the present invention is shown in FIG. 8. JTAG mirroring circuitry 402 includes TAP controller 601, instruction register 602, data registers such as registers 603–606, and multiplexers 611–612. JTAG mirroring circuit 402 may be placed in embedded portion 406 to augment the functionality of JTAG circuit 401 without having to redesign JTAG circuit 401. JTAG mirroring circuit 402 may include any number of data registers in addition to or instead of the data registers shown in FIG. 8 that perform any desired functions. For example, data registers in circuit 402 may include a device identification (ID) register that stores an ID number for the chip.

TAP controller 601 and TAP controller 501 are identical in terms of their functionality. Therefore, TAP controller 601 mirrors TAP controller 501. However, TAP controller 601 may have a different hardware implementation than TAP controller 501. TAP controller 601 is responsive to clock signal TCLK and test mode select signal TMS. If desired, TAP controller 601 may also be responsive to reset signal TRST. Clock signal TCLK controls the timing of circuitry within TAP controller 601.

TAP controller 601 sends control signals along each of control lines 620 and 621 to instruction register 602 and data registers 603–606, respectively. Each of control lines 620 and 621 includes signals UPDATEIR, CLOCKIR, and SHIFTIR. These control signals control the operation of the instruction register and the data registers. For example, control signals on lines 620–621 control when bits are serially shifted through instruction register 602 and data registers 603–606 in response the TMS signal. Bits are serially shifted into instruction register 602 and data registers 603–606 from the test mode input (TDI).

The functionality of instruction register 602 is identical to the functionality of instruction register 502. However, instruction register 602 may have a different hardware implementation than instruction register 502. Bits that are loaded into instruction register 602 are decoded by instruction decoder 610. The decoded output signals of decoder 610 determine which one of data registers 603–606 is selected. When one of data registers 603–606 is selected, the functions of that data register are performed by BST circuit 402.

Other output signals of decoder 610 control multiplexer 611. Multiplexer 611 selects one of data registers 603–606 and couples it to an input of multiplexer 612. TAP controller 601 sends a signal (not shown) to a select input of multiplexer 612 which determines which one of data registers 603–606, instruction register 602, or the TDX output of BST circuit 401 is coupled to output TDO. When multiplexer 612 couples one of data registers 603–606, instruction register 602, or the TDX output to the TDO output, data stored in the corresponding register (i.e., registers 502–508 or 602–606) may be serially shifted out of that register to the TDO output.

When one of data registers 603–606 is enabled, Bypass register 503 in circuit 401 is enabled and its data bits are shifted to the TDX output. This ensures that data at TDI intended for data register 603–606 does not affect data registers 504–508 in circuit 401, which may be a problem because data registers 504–508 are not programmed to avoid interfering with the functions performed by data registers 603–606. Bypass register 503 does not access any I/O pins in the PLD or in the embedded logic. Instruction register 602 is only responsive to certain values at TDI that are intended to enable data registers 603–606. Therefore, data registers 603–606 are disabled and do not interfere with functions being performed by one of data registers 504–508 when one of data registers 504–508 is enabled.

When data bits in instruction register 602 cause Configuration DMA register 603 to be selected, data signals can be serially shifted into Configuration DMA register 603 from TDI and out of Configuration DMA register 603 to the TDO output. Configuration DMA register 603 enables data communications between a host processor (external to chip 400) and embedded logic portion 406 of chip 400. For example, data signals can be transmitted between memory in embedded logic portion 406 and memory within the host processor. In another example, the host processor can communicate with software running on processor 403 in embedded logic portion 406. The processor 403 software can access data stored in the host processor in order to test or debug it. Therefore, Configuration DMA register 603 is a communications interface between embedded logic portion 406 and an external host processor.

When data bits in instruction register 602 cause Fast Communications register 604 to be selected, data signals can be serially shifted into Fast Communications register 604 from TDI and out of Fast Communications register 604 to the TDO output. Fast Communications register 604 also enables data communications between a host processor external to chip 400 and embedded logic portion 406 of chip 400. Fast Communications register 604 may perform many or all of the functions that are performed by Configuration DMA register 603. However, Fast Communications register 604 uses a different communications transfer protocol than Configuration DMA register 603 to transfer data signals between embedded logic portion 406 and the host processor. The configuration DMA and fast communications registers are discussed in further detail below.

Figure 9:
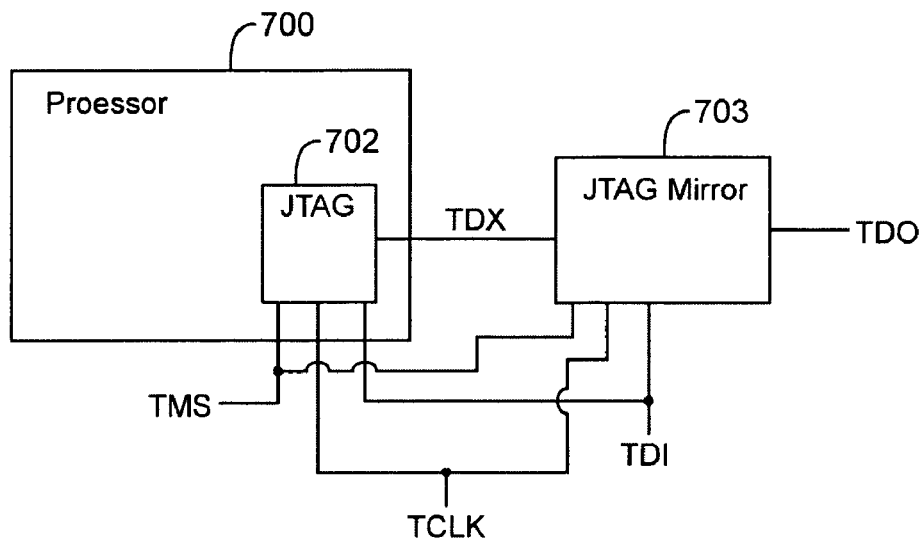
FIG. 9 is a block diagram of JTAG mirroring circuit of the present invention coupled to JTAG circuitry in a processor.

In another embodiment of the present invention, JTAG mirror circuit 703 may be coupled to JTAG circuit 702 in processor 700 as shown in FIG. 9. In this embodiment of the present invention, JTAG mirror circuit 703 augments the functionality of processor JTAG circuit 702 by adding additional data registers that function in parallel with data registers in JTAG circuit 702. For example, JTAG circuit 702 may require an external clock signal to function properly. If that external clock signal is not present, JTAG circuit 702 does not operate properly and may cause errors. JTAG mirror circuit 703 may include a Bypass register that performs a bypass function around data registers in JTAG circuit 702 without the need for an external clock signal.

JTAG mirror circuit 703 may be designed as shown in FIG. 8, except that JTAG circuit 703 includes only two data registers: a Bypass register, and a device ID register. JTAG circuit 703 also includes an instruction register and a TAP controller. JTAG circuit 702 may operate as discussed above with respect to JTAG circuit 401 in FIG. 7. The test data output of JTAG circuit 702 is coupled to the TDX input of JTAG circuit 703. JTAG circuits 702 and 703 receive signals TCLK, TMS, and TDI.

The Configuration DMA Scan Chain

The configuration DMA scan chain is a series of bits representing instructions from an external host processor indicating to a target processor (e.g., processor 403) to perform various actions. First, the host processor loads a configuration DMA instruction into the JTAG instruction register, which causes the configuration DMA register to be selected. Actions (as defined in table 2 below) may then be loaded into the configuration DMA register. After a first action is scanned into the configuration DMA register, the host processor can make an attempt to read the results of the first action in the configuration DMA register. A second action is not accepted by the configuration DMA register until the first action has been completed, and the configuration DMA register has communicated the results of the first action to the host processor. Therefore, the second action must be continuously scanned into the configuration DMA register until the first action is completed. When the host processor reads that the first action is completed by the target processor, the host processor scans in a second action, at which point the configuration DMA register accepts the second action and begins to implement it.

Figure 10:
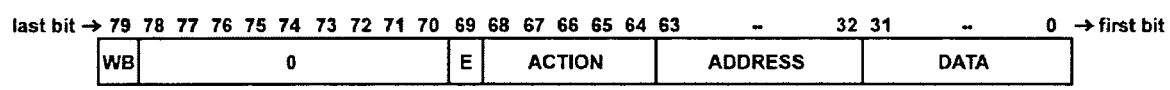
FIG. 10 is a diagram of a configuration DMA scan chain.

The scan chain is 80 bits long, with an associated configuration DMA register. Both are subdivided into fields as shown in FIG. 10. Further details are shown in Tables 1 and 2. The least significant bit of the data register is the first bit scanned out of TDO.

TABLE 1

| | |
|---|---|
| DATA | Data bits for read/write actions. |
| ADDRESS | Address bits for read/write actions. |
| ACTION | The action to be performed in the Update-DR state. |
| E | The last action resulted in an error. |
| WB | Write/Busy. On write this indicates that the scan chain should be written to the register. On read indicates that the previous action has not completed. |
| 0 | Reserved for future use. Write as 0 to ensure future compatibility. |

TABLE 2

| Bit Representation | Action |
|---|---|
| 00000 | Reset |
| 00001 | Get Status |
| 00010 | Word Write |
| 00011 | Word Read |
| 00100 | Halfword Write |
| 00110 | Byte Write |

In the Capture-DR state the contents of the configuration DMA register are parallel loaded into the Configuration DMA scan chain. If the WRITE/BUSY bit in the shift register is set in the Update-DR state, then the configuration DMA scan chain is parallel loaded into the configuration DMA register. The configuration DMA register is reset to zero by warm reset and when the JTAG state machine is in the Test-Logic-Reset state.

A state machine within the configuration logic (in the AHB2 clock domain) monitors the configuration DMA register. Whenever the WRITE/BUSY bit is set, the action specified by bits 64–68 in the configuration DMA scan chain are be performed. Once the action has been completed, the WRITE/BUSY bit will be reset. The actions supported are described in the following sections.

Reset

This action asserts the reset line output to the reset and mode control block. The resulting warm_reset signal resets the whole register. Unlike all the other actions, the assertion of the reset line does not depend on AHB2 clock for correct operation (although the resetting of WRITE/BUSY does).

Get Status

Figure 11:
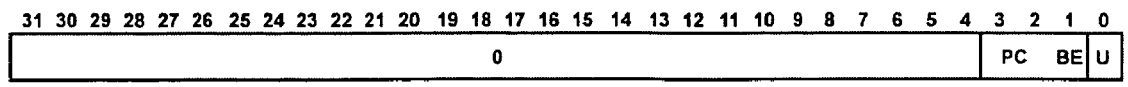
FIG. 11 is a diagram of the data field of the configuration DMA register.

When the action field of the configuration DMA scan chain holds this value, the ADDRESS field is set to the embedded JTAG version number, bits 31:1 of the DATA field are set to indicate the device status (as shown in FIG. 11), the E bit is reset and then the WRITE/BUSY bit is reset. This section defines embedded JTAG version 0.

The device status (stored in bits 0 . . . 31 of the configuration DMA register) is formatted as shown in FIG. 11. Further information about the bits in the DATA field is shown in Table 3.

TABLE 3

| | |
|---|---|
| U | This bit is not modified by hardware as a result of the Get Status action. |
| BE | Chip is in big endian mode. |
| PC | If non zero then the programmable logic circuitry is being configured (01 - by external pins; 10 - via slave interface). |
| 0 | Reserved for future use. Will be read as 0. |

This instruction can also be used to check that the AHB2 clock is running by issuing it twice with different values of the U bit. If the clock is running then the WRITE/BUSY bit will be cleared and the ACTION and U fields will have the same values as originally written. If the WRITE/BUSY field is not reset or if the values read back in the ACTION and U fields differ then the AHB2 clock is not running.

Word Write

When the action field holds this value the configuration DMA logic writes the word specified in the DATA field into the address specified in the ADDRESS field (bits 0 and 1 of the address must be 0). When the write has completed the E bit is set according to the result and the WRITE/BUSY bit is reset.

Word Read

When the action field holds this value the configuration DMA logic writes the word specified in bits 0 . . . 15 of the DATA field into the address specified in the ADDRESS field (bit 0 of the address must be 0). When the write has completed the E bit is set according to the result and the WRITE/BUSY bit is reset.

Halfword Write

When the action field holds this value the configuration DMA logic writes the word specified in bits 0 . . . 15 of the DATA field into the address specified in the ADDRESS field (bit 0 of the address must be 0). When the write has completed the E bit is set according to the result and the WRITE/BUSY bit is reset.

Byte Write

When the action field holds this value the configuration DMA logic writes the word specified in bits 0 . . . 7 of the DATA field into the address specified in the ADDRESS field. When the write has completed the E bit is set according to the result and the WRITE/BUSY bit is reset.

Unknown Actions

When the action field holds an unknown value the ACTION field is reset, the E bit is set and then the WRITE/BUSY bit is reset.

FAST JTAG COMMUNICATIONS PORT

Problem

When transferring data to a piece of hardware via a JTAG scan chain the usual Scan-DR sequence (Capture-DR; Shift-DR; Update-DR) imposes a high overhead on small data transfers; with n TAP controllers on a serial chain (n+5) extra clocks are required for each scan. A JTAG scan moves data both from the test equipment to the TAP and to the test equipment from the TAP. The number of clocks and the efficiency is the same in both cases so only data transfer from test equipment to the TAP is considered.

Normal JTAG scan chains must be a fixed length, so if the amount of data to be transferred is variable (for example one or more 32 bit words) then the usual method would be to use a 32 bit scan chain to transfer the data. If there are 30 other TAP controllers on the chain (a large, but not unusual number) then it will take 67 clocks to transfer each 32 bit word, a transfer efficiency of 47.7% regardless of the number of words transferred.

When the data to be transferred is going to be programmed into a flash chip the transfer efficiency is important since this directly affects the programming time.

Solution

Figure 12:
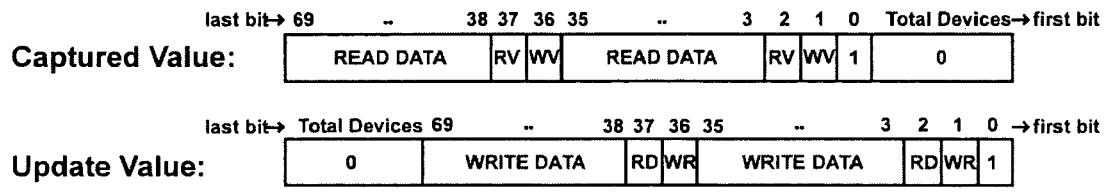
FIG. 12 is a diagram of a variable length scan chain.

A new form of scan chain is specified which takes actions on selected clocks in the Shift-DR state instead of, or in addition to, the actions usually taken in the Update-DR and Run-Test-Idle states. Using this chain it is possible to transfer a variable number of 32 bit words using 34 clocks per word plus setup clocks. This gives an efficiency of 46.3% to transfer a single word, 88.4% to transfer 16 words, 93.7% to transfer 256 words, etc. The scan chain appears to the test equipment as a variable length register containing one or more words with associated control equipment. FIG. 12 indicates an example of such a variable length scan chain. The initial "1" allows the hardware to synchronize with the data stream transmitted by the test equipment, it is followed by the data and is finally padded out with zeros as the final data is scanned out via TDO.

Figure 13:
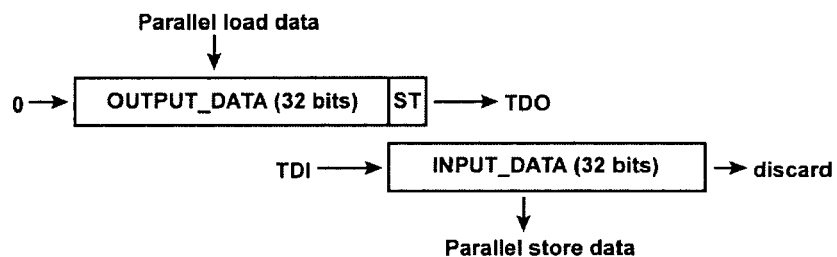
FIG. 13 is a diagram of an implementation of a variable length scan chain.

The scan chain is implemented using two parallel registers. Data is scanned into one register and, based on the values shifted in is parallel loaded into the other register and shifted out, apparently one bit later. By shifting data through the whole scan chain and reading the values which appear at TDO data may be written to, and read from, the TAP controller. An implementation of a variable length scan chain is shown in FIG. 13.

Figure 14:
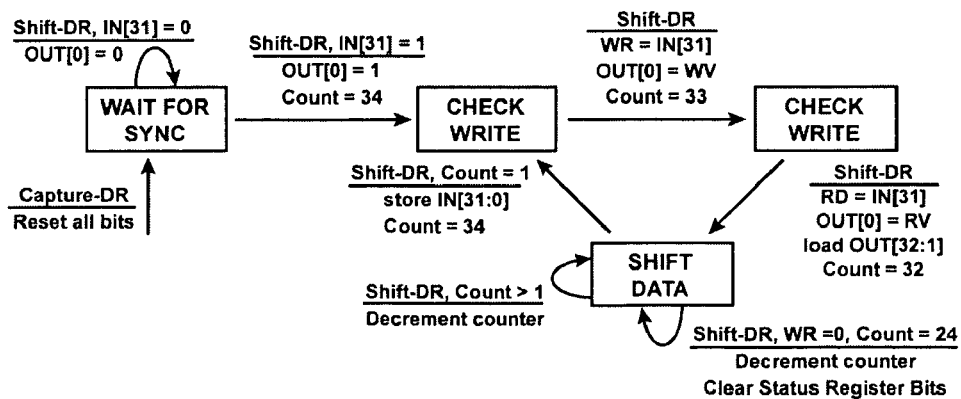
FIG. 14 is a diagram of a controlling state machine for an example variable length scan chain.

A state machine controls the values scanned out of the variable length chain. FIG. 14 illustrates a controlling state machine with an example variable length scan chain. This state machine is responsible for synchronizing with the data stream from the host and then ensuring that the correct shift, parallel load and parallel store operations occur in the correct sequence.

Debugger stubs running on the processor may need to communicate debugging data to a host. The fast communications port is provided to allow this to happen without undue delay to the processor. This port can also be used to transmit data to a FLASH programming stub on the device.

Figure 15:
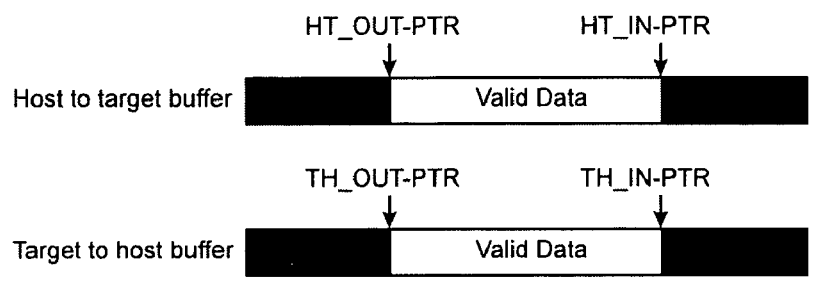
FIG. 15 is a diagram of circular buffers used for JTAG fast communications.

Two circular buffers of 32 bit words are used for JTAG fast communications as shown, for example, in FIG. 15. The first holds data transmitted to the target processor via JTAG and the second holds data awaiting reception by the host processor. The location and size of the first buffer is configurable, the second buffer always follows directly after the first. In traditional circular buffer style, the buffer is empty when the in and out pointers are equal. The number of entries in the buffer is calculated as (IN_PTR-OUT_PTR)/SIZE.

A JTAG scan chain allows a host to add entries to the host processor to target processor chain and remove entries from the target processor to host processor chain. Registers provide access to the in and out pointers for use by the target processor. An interrupt indicates when data is available for the target processor, or when there is space in the buffer for communications with the host processor.

Fast Communications Scan Chain

Figure 16:
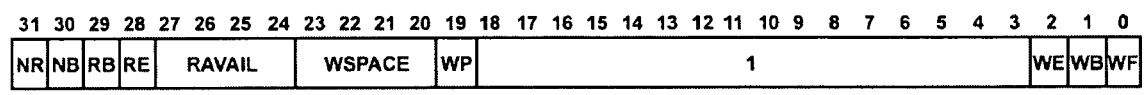
FIG. 16 is a diagram of status register associated with a JTAG state machine.

The host processor can access the communications buffers with this scan chain. It is designed with the assumption that when it is used all other TAP controllers in the JTAG chain have been placed in the BYPASS state. It appears to software as shown in FIG. 16. When accessing the chain in the usual way, it appears as a variable length chain containing an initial 1, followed by one or more blocks of 34 bits (software can use as many blocks as desired). Each block contains two control or status bits followed by the data value read or written. When using standard JTAG access software, a number of zero bits will appear at the beginning of the captured value; the same number of zero bits must be appended to the update value for correct operation.

In the Capture-DR state both registers are loaded with the value 0. No special actions take place in the Update-DR state. In the Shift-DR state, the chain behaves as though the registers are shifted as usual, then immediately afterwards a series of optional load/store actions occur (hardware will probably combine these actions into a parallel load and shift action).

The state machine in FIG. 14 describes when the load/store actions occur and what values are loaded or stored. The scan chain waits for the initial one bit (this will be preceded by a variable number of zeros depending on how many TAPS are before this one in the scan chain) and outputs a one bit to allow the software to synchronize the output.

The next two input bits are control bits (described in other sections herein); the corresponding status bits are output immediately after the synchronization bits. The output value is parallel loaded at the same time as the second status bit. The next thirty two bits clocked in contain the value to be stored, after these clocks the input value is available in the input shift register and is processed.

The control/data value sequence continues until all values have been processed. Software will clock in zeros at the end of the chain; since a zero control bit has no side effects this is safe.

Host to Target Actions

If the WR (write) bit is set then, if possible, the value in the INPUT_DATA register will be stored into the host to target buffer. This write will succeed if there is space in the buffer and if writes are not stalled. If there is no space in the buffer then writes will be marked as stalled to prevent future writes from occurring out of order. The WV (write valid) bit in the output register is set if the write succeeds.

If the WR bit is not set when a load/store action occurs then the value in the INPUT_DATA register is used to clear the corresponding bits in the status register. The WV bit is cleared.

Target to Host Actions

If the RD (read) bit is set then, if possible a value will be removed from the target to host buffer and stored into the OUTPUT_DATA register. The RV (read valid) bit in the output register is set if the read succeeds.

If the RD bit is not set, or if the read fails, then the RV bit is cleared and the contents of the status register are copied into the OUTPUT_DATA register.

Status Register

The status register holds information relating to the state of the communications system. It is read when data is not requested, or when valid data is not available. When the WR bit is 0 the INPUT_DATA bits set the corresponding bits in this register, clearing the latched errors (since all the settable bits are transmitted first, this action can occur before all bits have been clocked in). The status register is shown in FIG. 16. Further information about bits in the status register is shown in Table 4.

TABLE 4

| | | |
|---|---|---|
| WF | R/S | 0 indicates that writes are stalled due to buffer full. |
| WB | R/S | 0 indicates that writes are stalled due to insufficient bus bandwidth |
| WE | R/S | 0 indicates that writes are stalled due to bus error on write |
| 1 | R | Reserved for future use. Write as 0 (no change) for future compatibility |
| WP | R | 0 indicates that the last write has not yet been accepted |
| RAVAIL | R | Proportion of valid words in target to host buffer (1000 = 50% etc) |
| WSPACE | R | Proportion of spaces available in host to target buffer (1100 = 75% etc) |
| RE | R | 0 indicates that read data is not available due to buffer empty |
| RB | R | 0 indicates that read data is not available due to insufficient bus bandwidth |
| NB | R | 0 indicates that No Buffers for fast communications have been allocated |
| NR | R | 0 indicates that the scan chain is temporarily Not Ready to read or write and that all other bits in the register are invalid |

WF and WB are set to 1 (the no error state) by Capture-DR.

If the NR (not ready) bit is 0 then all other bits must be ignored by the host processor since they may be invalid—the host processor must leave the Shift-DR state without requesting any more reads or writes. Once the JTAG state machine has moved through Capture-DR, the scan chain is be ready to perform more reads and writes.

The WP bit indicates that the last write has not been accepted by the scan chain. If the TAP enters the test-logic-reset state while this bit is set then the write is lost.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope of the invention as set forth. Therefore, many modifications may be made to adapt a particular situation or material to the teachings of the invention without departing from the essential scope and spirit of the present invention. It is intended that the invention not be limited to the particular embodiments disclosed, but that the invention will include all embodiments and equivalents falling within the scope of the claims.

What is claimed is:

1. An integrated circuit, comprising:
a programmable logic portion comprising a plurality of programmable logic cells configurable to perform logic functions;
a first JTAG circuit coupled to the programmable logic portion, wherein the first JTAG circuit comprises a first TAP controller coupled to a first instruction register and a first plurality of data registers; and
an embedded logic portion comprising a processor and a second JTAG circuit coupled to the first JTAG circuit and to the processor, wherein the second JTAG circuit comprises a second TAP controller coupled to a second instruction register and a second plurality of data registers, and at least some of the second plurality of data registers in the second JTAG circuit are designed to perform functions that are not performed by the first plurality of data registers.

2. The integrated circuit of claim 1 wherein one of the first plurality of data registers comprises a data register that is used to load data into the programmable logic portion to configure logic circuitry in the programmable logic portion.

3. The integrated circuit of claim 1 wherein one of the first plurality of data registers comprises a data register that allows a user to transmit and receive data from the programmable logic portion.

4. The integrated circuit of claim 1 wherein one of the second plurality of data registers comprises a first data register that acts as a communications interface between the embedded logic portion of the integrated circuit and an external host processor.

5. The integrated circuit of claim 4 wherein the external host processor loads first action bits into the first data register indicating a first action to be performed by circuitry in the embedded logic portion, and wherein second action bits may not be loaded into the first data register until the first action has been performed and the first data register has communicated results of the first action to the external host processor.

6. The integrated circuit of claim 4 wherein the external host processor selects a variable length scan chain as the first data register.

7. The integrated circuit of claim 6 wherein the variable length scan chain is synchronized between the external host processor and the processor in the embedded logic portion using a particular pattern of ones and zeros.

8. The integrated circuit of claim 1 wherein the second plurality of data registers are disabled when one the first plurality of data registers is enabled.

9. The integrated circuit of claim 1 wherein the second plurality of data registers are coupled to a first multiplexer that is controlled by data signals decoded from the second instruction register, and an output of the first multiplexer, the second instruction register, and a test data output of the first JTAG circuit are coupled to a second multiplexer that is controlled by the second TAP controller.

10. The integrated circuit of claim 1 wherein the first plurality of data registers includes a bypass register that is enabled whenever one of the second plurality of data registers is enabled to ensure that data intended for the second plurality of data registers does not affect the first plurality of data registers.

11. An embedded logic portion of an integrated circuit, the integrated circuit comprising a programmable logic portion having a plurality of programmable logic cells configurable to perform logic functions, the embedded logic portion comprising:

a processor; and
a first JTAG circuit coupled to the processor and a second JTAG circuit that is part of control logic for the programmable logic portion, wherein the first JTAG circuit comprises a first TAP controller that outputs a plurality of control signals that control a first instruction register and a first plurality of data registers, the control logic being coupled to the programmable logic portion,
the second JTAG circuit having a second plurality of data registers at least some of the first plurality of data registers being designed to perform functions not performed by the second plurality of data registers.

12. The embedded logic portion of claim 11 wherein the second plurality of data registers is coupled to a second TAP controller, and wherein one of the second plurality of data registers comprises a bypass register that does not perform any function.

13. The embedded logic portion of claim 11 wherein the second plurality of data registers is coupled to a second TAP controller, and wherein one of the second plurality of data registers comprises a data register that can force data onto and capture data from a plurality of input/output pins.

14. The embedded logic portion of claim 11 wherein the second plurality of data registers is coupled to a second TAP controller, and wherein one of the second plurality of data registers comprises a data register that is used to load data into the programmable logic portion to configure logic circuitry in the programmable logic portion.

15. The embedded logic portion of claim 11 wherein the second plurality of data registers is coupled to a second TAP controller, and wherein one of the second plurality of data registers comprises a data register that allows a user to transmit and receive data from the programmable logic portion on input/output pins.

16. The embedded logic portion of claim 11 wherein one of the first plurality of data registers comprises a first data register that acts as a communications interface between the embedded logic portion and an external host processor.

17. The embedded logic portion of claim 16 wherein the external host processor loads first action bits into the first data register indicating a first action to be performed by circuitry in the embedded logic portion, and wherein second action bits may not be loaded into the first data register until the first action has been performed and the first data register has communicated results of the first action to the external host processor.

18. The embedded logic portion of claim 16 wherein the external host processor selects a variable length scan chain as the first data register.

19. The embedded logic portion of claim 11 wherein the first plurality of data registers are coupled to a first multiplexer that is controlled by data signals decoded from the first instruction register.

20. The embedded logic portion of claim 19 wherein an output of the first multiplexer, the first instruction register, and a test data output of the second JTAG circuit are coupled to a second multiplexer that is controlled by the first TAP controller.

21. A method for testing data using a chip that comprises a first processor and a programmable logic portion, comprising:
transmitting first data signals between pins and circuitry in the programmable logic portion using a first JTAG circuit that is part of the chip and coupled to the programmable logic portion, wherein the programmable logic portion has a plurality of programmable logic cells configurable to perform logic functions;

transmitting second data signals between an external host processor and the first processor using a second JTAG circuit in an embedded logic portion of the chip, performing a first set of functions using first data registers in the first JTAG circuit; and performing a second set of functions using second data registers in the second JTAG circuit, wherein at least some of the second set of functions performed by the second data registers are different than the first set of functions performed by the first data registers.

22. The method of claim 21 wherein the first and second JTAG circuits comprise first and second TAP controllers, respectively.

23. The method of claim 21 wherein transmitting the first data signals further comprises loading the first data signals into the programmable logic portion to configure logic circuitry in the programmable logic portion using a data register that is part of the first JTAG circuit.

24. The method of claim 21 transmitting the second data signals further comprises selecting from the second data registers in the second JTAG circuit using a first multiplexer that is controlled by signals decoded from an instruction register.

25. The method of claim 24 wherein transmitting the second data signals further comprises selecting from an output of the first multiplexer, an output of the instruction register, and a test data output of the first JTAG circuit using a second multiplexer that is controlled by a TAP controller in the second JTAG circuit.

26. An integrated circuit, comprising:

a processor coupled to a first JTAG circuit, wherein the first JTAG circuit comprises a first TAP controller coupled to a first instruction register and a first plurality of data registers;

a second JTAG circuit coupled to the first JTAG circuit, wherein the second JTAG circuit comprises a second TAP controller coupled to a second instruction register and a second plurality of data registers, and a multiplexer having a first input coupled to the first JTAG circuit and a second input coupled to the second JTAG circuit, wherein the second plurality of data registers are designed to perform functions that are not performed by the first plurality of data registers.

27. The integrated circuit of claim 26 wherein the integrated circuit comprises an embedded logic portion and a programmable logic portion coupled to the first JTAG circuit, and wherein the second JTAG circuit is part of an embedded logic portion of the integrated circuit and wherein the programmable logic portion has a plurality of programmable logic cells configurable to perform logical functions.

28. The integrated circuit of claim 27 wherein the second JTAG circuit comprises a multiplexer having a first input coupled to an output of the first JTAG circuit and a second input coupled to receive data signals from one of the second plurality of data registers.

* * * * *